(12) United States Patent
Dani et al.

(10) Patent No.: US 7,311,967 B2
(45) Date of Patent: *Dec. 25, 2007

(54) THERMAL INTERFACE MATERIAL AND ELECTRONIC ASSEMBLY HAVING SUCH A THERMAL INTERFACE MATERIAL

(75) Inventors: Ashay A. Dani, Chandler, AZ (US); Paul A. Koning, Chandler, AZ (US); Saikumar Jayaraman, Chandler, AZ (US); Christopher L. Rumer, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 85 days.

This patent is subject to a terminal disclaimer.

(21) Appl. No.: 10/038,334

(22) Filed: Oct. 18, 2001

(65) Prior Publication Data

US 2003/0077478 A1    Apr. 24, 2003

(51) Int. Cl.
*B32B 5/16* (2006.01)
*B32B 18/00* (2006.01)
*B32B 27/38* (2006.01)
*B32B 13/04* (2006.01)
*B32B 15/04* (2006.01)

(52) U.S. Cl. .................. 428/323; 428/325; 428/328; 428/329; 428/330; 428/413; 428/418; 428/446; 428/447; 428/450; 428/461; 428/580; 428/913

(58) Field of Classification Search ............ 428/323, 428/325, 328, 329, 330, 411.1, 413, 418, 428/446, 447, 450, 461, 580, 913
See application file for complete search history.

(56) References Cited

U.S. PATENT DOCUMENTS

| | | | | |
|---|---|---|---|---|
| 5,062,896 A | * | 11/1991 | Huang et al. | 106/287.19 |
| 5,945,217 A | * | 8/1999 | Hanrahan | 428/389 |
| 6,284,817 B1 | * | 9/2001 | Cross et al. | 523/220 |
| 6,479,763 B1 | * | 11/2002 | Igaki et al. | 174/262 |
| 6,813,153 B2 | * | 11/2004 | Koning et al. | 361/700 |

FOREIGN PATENT DOCUMENTS

| | | |
|---|---|---|
| EP | 0 790 762 A2 | 8/1997 |
| EP | 1 143 511 A2 | 10/2001 |
| EP | 1 143 512 A2 | 10/2001 |

OTHER PUBLICATIONS

PCT International Search Report, Feb. 11, 2003, 4 pages.

* cited by examiner

*Primary Examiner*—Sheeba Ahmed
(74) *Attorney, Agent, or Firm*—Blakely, Sokoloff, Taylor & Zafman LLP

(57) ABSTRACT

A thermal interface material is described for thermal coupling of an electronic component to a thermally conductive member. The thermal interface material includes a viscoelastic polymer matrix material, fusible solder particles in the matrix material, and filler particles in the matrix material. The solder particles have a melting temperature below a selected temperature (e.g. 157° C. for indium) and the filler particles have a melting temperature substantially above the selected temperature (e.g. 961° C. for silver). The filler particles keep the thermal interface material intact under adverse thermal and stress conditions.

28 Claims, 2 Drawing Sheets

THERMAL INTERFACE MATERIAL AND ELECTRONIC ASSEMBLY HAVING SUCH A THERMAL INTERFACE MATERIAL

BACKGROUND OF THE INVENTION

1). Field of the Invention

This invention relates to a thermal interface material for thermal coupling of an electronic component to a thermally conductive member, and to an electronic assembly which has such a thermal interface material.

2). Discussion of Related Art

Integrated circuits are manufactured on semiconductor wafers, which are subsequently sawed or "diced" into individual dice. Such a die may have solder bump contacts on the integrated circuit. The solder bump contacts are located downwardly onto contact pads of a package substrate. Electronic signals can be provided through the solder bump contacts to and from the integrated circuit.

Operation of the integrated circuit causes heating thereof. Heat is conducted to an upper surface of such the die and has to be conducted or convected away to maintain the temperature of the integrated circuit below a predetermined level for the purpose of maintaining functional integrity of the integrated circuit.

A heat spreader is usually located above the die and thermally coupled to the die by a fluid thermal interface material such as thermally conductive grease. However, the thermally conductive grease has only a moderate thermal conductivity and thus provides a substantial thermal barrier for heat transferring from the die to the heat spreader.

BRIEF DESCRIPTION OF THE DRAWINGS

The invention is described by way of example with reference to the accompanying drawings wherein.

DETAILED DESCRIPTION OF THE INVENTION

General Description

Figure 1:
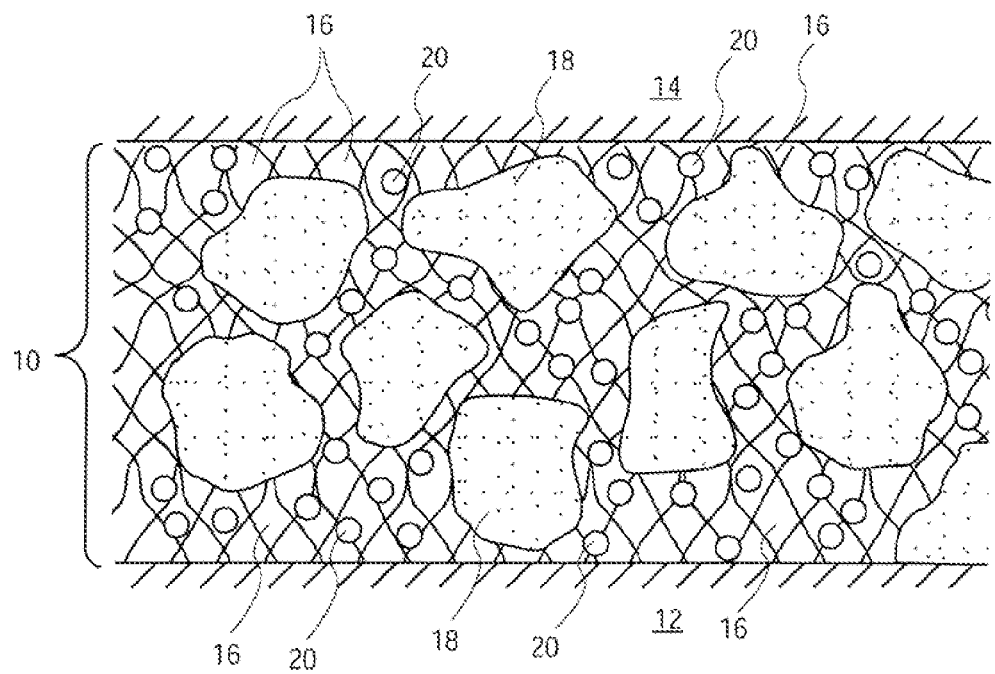
FIG. 1 is a cross-sectional side view with a thermal interface material located between an electronic component and a thermally conductive member.

FIG. 1 of the accompanying drawings illustrates a thermal interface material which is inserted between and used for thermal coupling of an electronic component 12 to a thermally conductive member 14. The thermal interface material 10 includes a viscoelastic polymer matrix material 16, fusible solder particles 18 in the matrix material 16, and filler particles 20 in the matrix material 16. The solder particles 18 have a melting temperature below a selected temperature and the filler particles 20 have a melting temperature above the selected temperature. The solder particles 18 will thus melt when the temperature increases to above the selected temperature but the filler particles 20 will not melt.

The matrix material 16 may comprise between 1% and 20% of the thermal interface material 10 by weight, and preferably comprises approximately 8% by weight.

The matrix material 16 may be a silicone, an amino epoxy, an acrylate, or olefin resin, a low-viscosity vinyl or a phase-change material, and is preferably silicone.

The solder particles 18 may comprise between 1% and 99% of the thermal interface material 10 by weight, preferably at least 5% by weight, and more preferably between 25% and 90% by weight.

The solder particles 18 preferably have a melting temperature of between 60 and 300° C. The solder particles 18 may be made of pure solder compositions such as indium (In) with a melting temperature of 157° C. or a solder alloy, such as indium tin (InSn) with a eutectic melting temperature of 118° C., indium silver (InAg) with a eutectic melting temperature of 139° C., tin silver (SnAg) or tin silver copper (SnAgCu) with eutectic melting temperatures of 217° C., tin bismuth (SnBi) with a eutectic melting temperature of 203° C., indium tin bismuth (InSnBi) with a melting temperature of between 60° C. and 140° C., or indium titanium (InTi), indium zirconium (InZr), indium titanium cerium selenium (InTiCeSe), indium silver titanium cerium selenium (InAgTiSeCe), with melting temperatures between 145° C. to 165° C., etc.

The solder particles 18 may have diameters of between 0.2 and 100. The solder particles 18 may be a mixture of fine and coarse particles The filler particles 20 may comprise between 1% and 95% of the thermal interface material 10 by weight, more preferably at least 10% by weight.

The solder particles 18 and the filler particles 20 together preferably comprise between 50% and 99% of the thermal interface material 10 by weight, and preferably comprise approximately 92% by weight.

The filler particles 20 (either fusible, non-fusible or ceramic particles) preferably have a melting temperature above 350° C. and more preferably between 800° C. and 1200° C. The filler particles 20 preferably have a melting temperature which is at least 100° C., more preferably at least 200° C., above a melting temperature of the solder particles 18. The filler particles 20 may be nickel (Ni), copper (Cu) with a melting temperature of 1084° C., silver (Ag) with a melting temperature of 961° C., silver copper (Ag/Cu), tin (Sn), and graphite, and preferably are aluminum (Al) with a melting temperature of 660° C. Examples of non-fusible fillers would be boron nitride, aluminum nitride, silicon carbide, aluminum oxide, graphite, carbon fiber, carbon nanotubes, or diamond.

Figure 2:
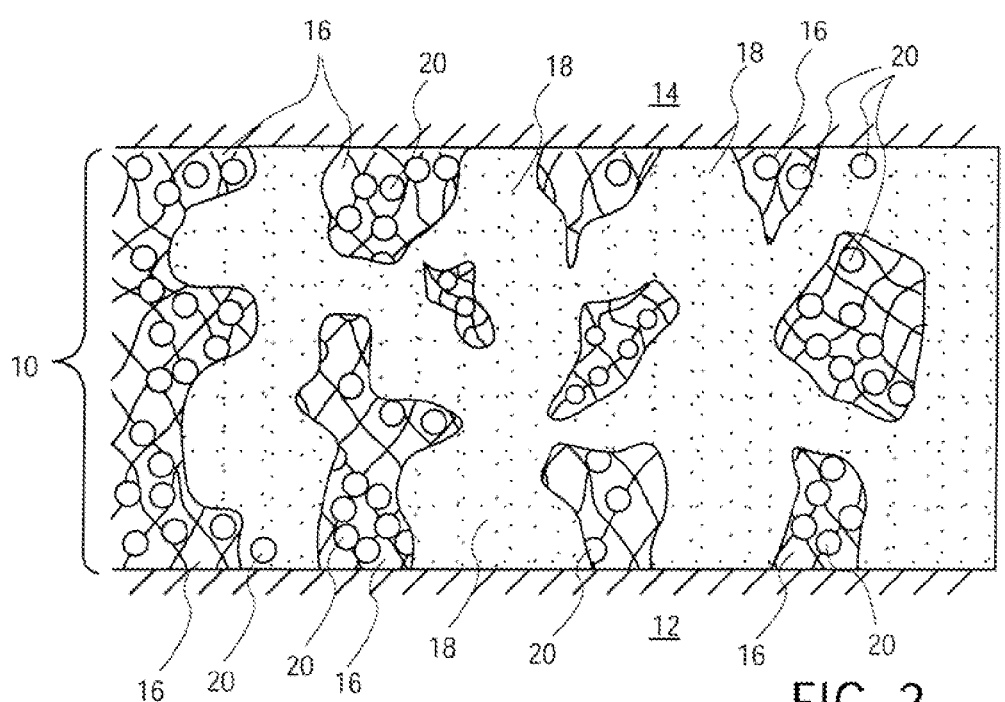
FIG. 2 is a view similar to FIG. 1 after heating and subsequent cooling of the thermal interface material to cause fusing and agglomeration of solder particles thereof.

The whole assembly, including the electronic component 12, the thermally conductive member 14, and the thermal interface material 10, is inserted into a furnace which heats the assembly from room temperature to a temperature above which the solder particles 18 melt. The solder particles 18 fuse and agglomerate together as shown in FIG. 2. Agglomeration is initiated by the fine ones of the solder particles 18. The temperature to which the assembly is heated is, however, maintained below a temperature at which the filler particles 20 melt. The assembly is then cooled to a temperature below the melting temperature of the solder particles 18 so that they solidify.

The temperature is further lowered to a selected temperature above room temperature at which the matrix material 16 cures. Cross-linking occurs between polymer chains of the matrix material 16 while it is being cured to enhance the viscoelastic properties of the matrix material 16. The matrix material 16 may be non-curable resins such as phase change materials, which crystallize and thereby solidify at room temperatures.

The temperature is then further lowered to room temperature. In the resulting structure, the solder particles 18 are agglomerated together and have large surfaces contacting both the electronic component 12 and the thermally conductive member 14 so as to provide an unbroken path through which heat can conduct from the electronic component 12 through the now-consolidated solder particles 18 to the thermally conductive member 14. The matrix material 12 has the ability to absorb stresses on the material. However, without the filler particles 20, the thermal interface material 10 may tend to flow out from between the electronic component 12 and the thermally conductive member 14 during thermal cycling and/or when exposed to high humidity. The filler particles 20 provide the necessary strength to prevent the thermal interface material 10 from flowing out from between the electronic component 12 and the thermally conductive member 14 under such conditions. The filler particles 20 thus keep the thermal interface material 10 intact during adverse stress and thermal conditions.

Figure 3:
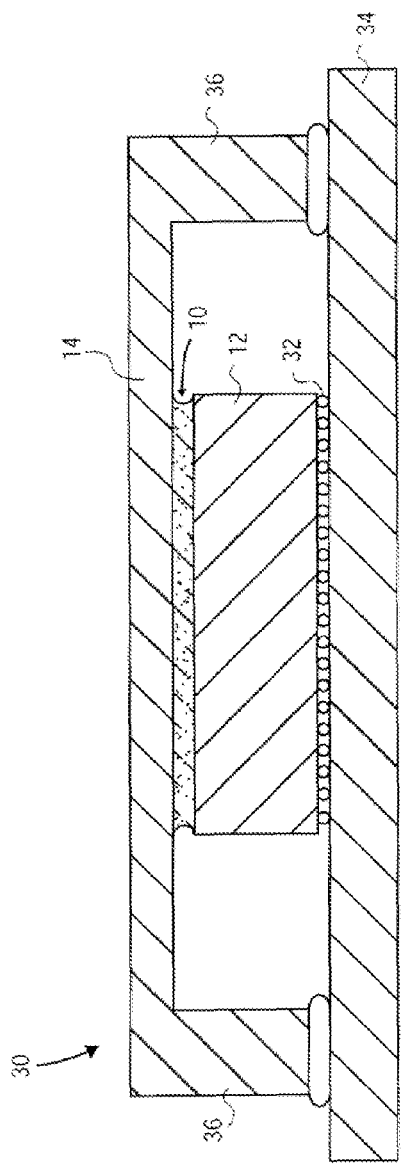
FIG. 3 is a cross-sectional side view of an electronic assembly including the thermal interface material.

FIG. 3 illustrates an assembly 30 including the electronic component 12, the thermally conductive member 14, and the thermal interface material 10. The electronic component 12 is a semiconductor die (hereafter referred to as a "die 12") having an integrated circuit formed in and on a lower surface thereof. Solder bump contacts 32 are formed on the integrated circuit. The assembly 30 further includes a package substrate 34 having contact pads (not shown) on an upper surface thereof. Each contact 32 is located on a respective contact pad. The combination of the package substrate 34 and the die 12 is then inserted into a furnace so that the contacts 32 melt, and is then cooled so that the contacts 32 secure the die 12 to the package substrate 34.

The thermally conductive member 14 is made of metal or ceramic and forms part of a metal cap having sides 36 extending downward from edges of the thermally conductive member 14 past the die 12 to the substrate 34. The thermal interface material 10 is in the form shown in FIG. 1 when the cap is located over the die 12. Only then is the assembly 30 located in a furnace so as to transform the thermal interface material 10 into the form shown in FIG. 2.

EXAMPLE

An example of the thermal interface material 10 is now given.

The matrix material 16 is silicone comprising 8% of the thermal interface material 10 by weight. The solder material 18 is indium comprising 77% of the thermal interface material 10 by weight. Indium has a melting temperature of 157° C. and does not attack silicone when melted at a temperature above 157° C. The filler particles 20 are made of aluminum comprising 15% of the thermal interface material 10 by weight. The solder particles 18 and the filler particles 20 thus comprise approximately 92% of the thermal interface material 10 by weight. Aluminum has a melting temperature of approximately 1200° C. The filler particles 20 thus melt at a temperature which is 1043° C. higher than the melting temperature of the solder particles 18.

Heat is generated by the die 12 and transferred through the solder particles 18 to the thermally conductive member 14. Differences in thermal expansion of the die 12 and the thermally conductive member 14 cause stresses on the material that are primarily absorbed by the viscoelastic matrix material 14.

Figure 4:
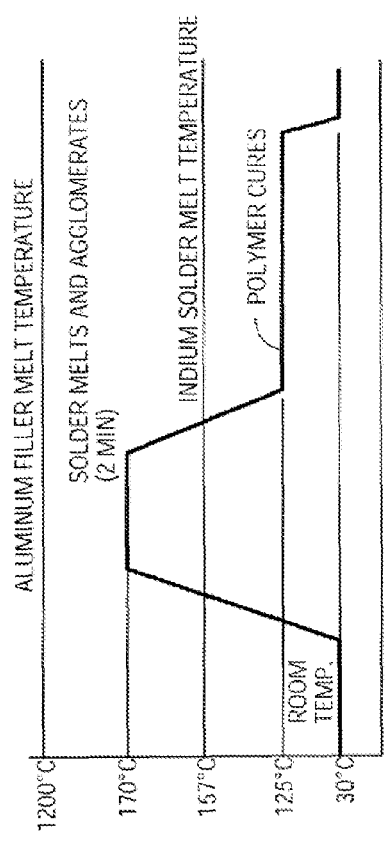
FIG. 4 is a graph of temperature against time illustrating an example of a cure and reflow temperature profile of the thermal interface material.

FIG. 4 illustrates a thermal cycle of the silicone/indium/aluminum composition. The composition is heated from room temperature of about 30° C. to approximately 170° C., which is above the melting temperature of indium so that the indium solder particles 18 melt. The composition is maintained at 170° C. for approximately two minutes, i.e., until sufficient agglomeration has occurred. The composition is then cooled to a temperature of approximately 125° C., which is below the solder material's melting point, and the solder particles solidify. The silicone polymer cures at 125° C. for about one hour. Curing time and temperature may be varied and are related to one another.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A thermal interface material for thermal coupling of an electronic component to a thermally conductive member, comprising:
    a viscoelastic polymer matrix material;
    fusible metal solder particles in the matrix material, having a melting temperature below a selected temperature of 300° C.; and
    filler particles in the matrix material, having a melting temperature above the selected temperature.

2. The thermal interface material of claim 1 wherein the matrix material comprises between 1 and 20% by weight of the thermal interface material.

3. The thermal interface material of claim 2 wherein the matrix material comprises approximately 8% by weight of the thermal interface material.

4. The thermal interface material of claim 1 wherein the matrix material is selected from the group consisting of a silicone, an amino epoxy, and acrylate, an olefin resin, and a phase-change material.

5. The thermal interface material of claim 4 wherein the matrix material is silicone.

6. The thermal interface material of claim 5 wherein the solder particles comprise between 1 and 99% by weight of the thermal interface material.

7. The thermal interface material of claim 6 wherein the solder particles comprise at least 5% by weight of the thermal interface material.

8. The thermal interface material of claim 7 wherein the solder particles comprise between 25 and 90% by weight of the thermal interface material.

9. The thermal interface material of claim 1 wherein the solder particles are selected from the group consisting of In, InSn, InAg, SnAg, SnAgCu, SnBi, InSnBi, InTi, InZr, InTiCeSe, and InAgTiSeCe.

10. The thermal interface material of claim 1 wherein the matrix material is silicone and the solder particles do not substantially attack the silicone when the solder particles melt.

11. The thermal interface material of claim 1 wherein the solder particles have a melting temperature between 60 and 300° C.

12. The thermal interface material of claim 11 wherein the solder particles have a melting temperature of approximately 157° C.

13. The thermal interface material of claim 1 wherein the solder particles have widths of between 0.2 and 100 microns.

14. The thermal interface material of claim 1 wherein the filler particles comprise between 1 and 95% of the thermal interface material by weight.

15. The thermal interface material of claim 14 wherein the filler particles comprise at least 10% by weight of the thermal interface material.

16. The thermal interface material of claim 15 wherein the filler particles comprise approximately 15% by weight of the thermal interface material.

17. The thermal interface material of claim 15 wherein the solder particles and the filler particles comprise between 50 and 95% by weight of the thermal interface material.

18. The thermal interface material of claim 17 wherein the solder particles and the filler particles comprise approximately 92% by weight of the thermal interface material.

19. The thermal interface material of claim 15 wherein the filler particles are selected from the group consisting of Ni, Cu, Ag, Ag/Cu, Sn, graphite and Al.

20. The thermal interface material of claim 19 wherein the filler particles are Al.

21. The thermal interface material of claim 15 wherein the filler particles have a melting temperature above 350° C.

22. The thermal interface material of claim 16 wherein the filler particles have a melting temperature which is at least 100° C. above a melting temperature of the solder particles.

23. The thermal interface material of claim 15 wherein the filler particles have a melting temperature which is at least 200° C. above a melting temperature of the solder particles.

24. A thermal interface material for thermal coupling of an electronic component to a thermally conductive member, comprising:

a viscoelastic polymer matrix material;

fusible metal solder particles in the matrix material, having a melting temperature below 200° C. and do not substantially attack the matrix material when the solder particles are melted; and filler particles in the matrix material, having a melting temperature above 400° C.

25. The thermal interface material of claim 24 wherein the matrix material is silicone.

26. The thermal interface material of claim 25 wherein the filler particles are aluminum.

27. An electronic assembly comprising:

an electronic component which generates heat when operated;

a thermally conductive member spaced from the electronic component; and a thermal interface material between the electronic component and the thermally conductive member, the thermal interface material including a viscoelastic polymer matrix material, metal solder particles that are fused together so as to provide an unbroken thermal path for heat to conduct from the electronic component and the thermally conductive member and having a melting temperature below a selected temperature, and filler particles in the matrix material having a melting temperature which is at least 100° C. above the selected temperature.

28. The electronic assembly of claim 27 wherein at least one of the filler particles is in contact with and entirely surrounded by one of the solder particles.

* * * * *